(12) United States Patent
Byrne et al.

(10) Patent No.: US 6,845,015 B2
(45) Date of Patent: Jan. 18, 2005

(54) SYSTEM FOR REPLACING A COMPONENT IN A CABINET AND A METHOD FOR INSTALLING A REPLACEABLE COMPONENT IN A CABINET

(75) Inventors: Vincent Mark Byrne, Mesquite, TX (US); Roosevelt O'brian Carr, Plano, TX (US); Dibyendu Narayan Nath, Plano, TX (US); Paul Scott Nessman, Mesquite, TX (US)

(73) Assignee: Tyco Electronics Power Systems, Inc., Mesquite, TX (US)

( * ) Notice: Subject to any disclaimer, the term of this patent is extended or adjusted under 35 U.S.C. 154(b) by 19 days.

(21) Appl. No.: 10/218,927

(22) Filed: Aug. 14, 2002

(65) Prior Publication Data

US 2004/0032721 A1 Feb. 19, 2004

(51) Int. Cl.$^7$ .............................. H05K 1/14; H05K 7/14; H05K 7/18
(52) U.S. Cl. ....................... 361/741; 361/740; 361/732; 361/747; 361/759; 361/801; 361/802; 361/796
(58) Field of Search ................................. 361/683–686, 361/728, 731, 732, 736, 740, 741, 747, 748, 752, 756, 759, 801, 802, 807, 724–727, 796

(56) References Cited

U.S. PATENT DOCUMENTS 5,394,305 A * 2/1995 Moral et al. ................ 361/796
6,385,051 B1 * 5/2002 Perez et al. ................. 361/759

* cited by examiner

Primary Examiner—Phuong T. Vu
(74) Attorney, Agent, or Firm—Law Office of Donald D. Mondul

(57) ABSTRACT

A system is configured for installing a replaceable component at a replaceable component locus in an equipment cabinet having a front and back plane and a plurality of sides. A fixed component occupies a first volume that establishes a replaceable component volume between the first volume and the back plane. The system includes: (a) a substrate supporting the replaceable component that presents substantially parallel first and second edges in a substrate plane; and (b) a guide structure fixed with the cabinet that cooperates with the substrate to slidingly move the substrate along a replacement route between the front plane and a replacement locus in the replaceable component volume in alternate first and second installation movements. The first installation movement is responsive to a first installation force applied to the substrate in the substrate plane. The second installation movement is responsive to a second installation force applied generally perpendicular with the substrate plane.

17 Claims, 11 Drawing Sheets

SYSTEM FOR REPLACING A COMPONENT IN A CABINET AND A METHOD FOR INSTALLING A REPLACEABLE COMPONENT IN A CABINET

BACKGROUND OF THE INVENTION

The present invention is directed to a system and method for installing a replacement component in an equipment cabinet, and especially to effecting such installation with minimal interruption of operation of equipment located in the cabinet.

Effecting quick replacement of components in equipment cabinets is important to minimize disruption of operation of equipment contained in the cabinet. Such replacement installation is particularly difficult to carry out expeditiously when the component to be replaced is connected in a location behind another component. Market pressures are being manifested in smaller products mounted more densely in cabinets. Under such circumstances, fewer design choices are available for providing room in cabinets for facilitating later replacement of components. Today's densely populated equipment cabinets using prior art mounting systems and methods often require removing a front mounted component in order to gain access for removing and replacing a rear mounted component. Removal of a front mounted component may disrupt operations performed by the equipment in the cabinet.

One example of equipment in which such a problematical arrangement is found is in power supply apparatuses that include low voltage disconnect (LVD) contactor devices. Providing front access and easy "hot-swap" capability for replacement of a failed LVD contactor is a problem because such LVD contactors are usually bulky, they are connected with live buswork, they generate heat and they do not require front access for human interaction during operation. In some small power systems space is available for an LVD contactor behind a wiring area or distribution area. Such a space is functionally well-suited for an LVD contactor during normal operation when no human operator interaction is required, but is a difficult location to provide front access to facilitate replacement of the contactor.

There is a need for a system and method for mounting components within a cabinet that permits replacement of a component mounted behind a function-critical unit without disturbing the front-mounted function-critical unit. The system and method preferably permits high density population of an equipment cabinet and allows access to a rear-mounted replacement component without disturbing the front-mounted function-critical unit. The system and method preferably occupies a minimum amount of frontal area when the replacement component is installed while permitting field replacement of the component without powering down the system in which it is employed. The system and method may permit access to the replacement component by moving no other components or by requiring moving only non-critical components without disturbing the front-mounted function-critical component.

SUMMARY OF THE INVENTION

A system is configured for installing a replacement component at a replacement locus in an equipment cabinet having a front and back plane and a plurality of sides. A fixed component occupies a first volume that establishes a replacement volume between the first volume and the back plane. The system includes: (a) a substrate supporting the replacement component that presents substantially parallel first and second edges in a substrate plane; and (b) a guide structure fixed within the cabinet that cooperates with the substrate to slidingly move the substrate along a replacement route between the front plane and a replacement locus in the replacement volume in first and second installation movements. The first installation movement is responsive to a first installation force applied to the substrate in the substrate plane. The second installation movement is responsive to a second installation force applied generally perpendicular with the substrate plane.

The method includes the steps of: (a) providing a substrate supporting the replacement component that presents substantially parallel first and second edges in a substrate plane; (b) providing a guide structure fixed within the cabinet that cooperates with the substrate for slidingly moving the substrate along a replacement route between the front plane and a replacement locus in the replacement volume; and (c) effecting a sliding movement using first and second installation movements. The first installation movement is responsive to a first installation force applied to the substrate in the substrate plane. The second installation movement is responsive to a second installation force applied generally perpendicular with the substrate plane.

It is, therefore, an object of the present invention to provide a system and method for installing a replacement component in a cabinet that permits replacement of a component mounted behind a function-critical unit without disturbing the front-mounted function-critical unit.

It is a further object of the present invention to provide a system and method for installing a replacement component in a cabinet that permits high density population of an equipment cabinet and allows access to a rear-mounted replacement component without disturbing the front-mounted function-critical unit.

It is a still further object of the present invention to provide a system and method for installing a replacement component in a cabinet that occupies a minimum amount of frontal area when the replacement component is installed while permitting field replacement of the component without powering down the system in which it is employed.

It is yet a further object of the present invention to provide a system and method for installing a replacement component in a cabinet that may permit access to the replacement component by moving no other components or by requiring moving only non-critical components without disturbing the front-mounted function-critical component.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
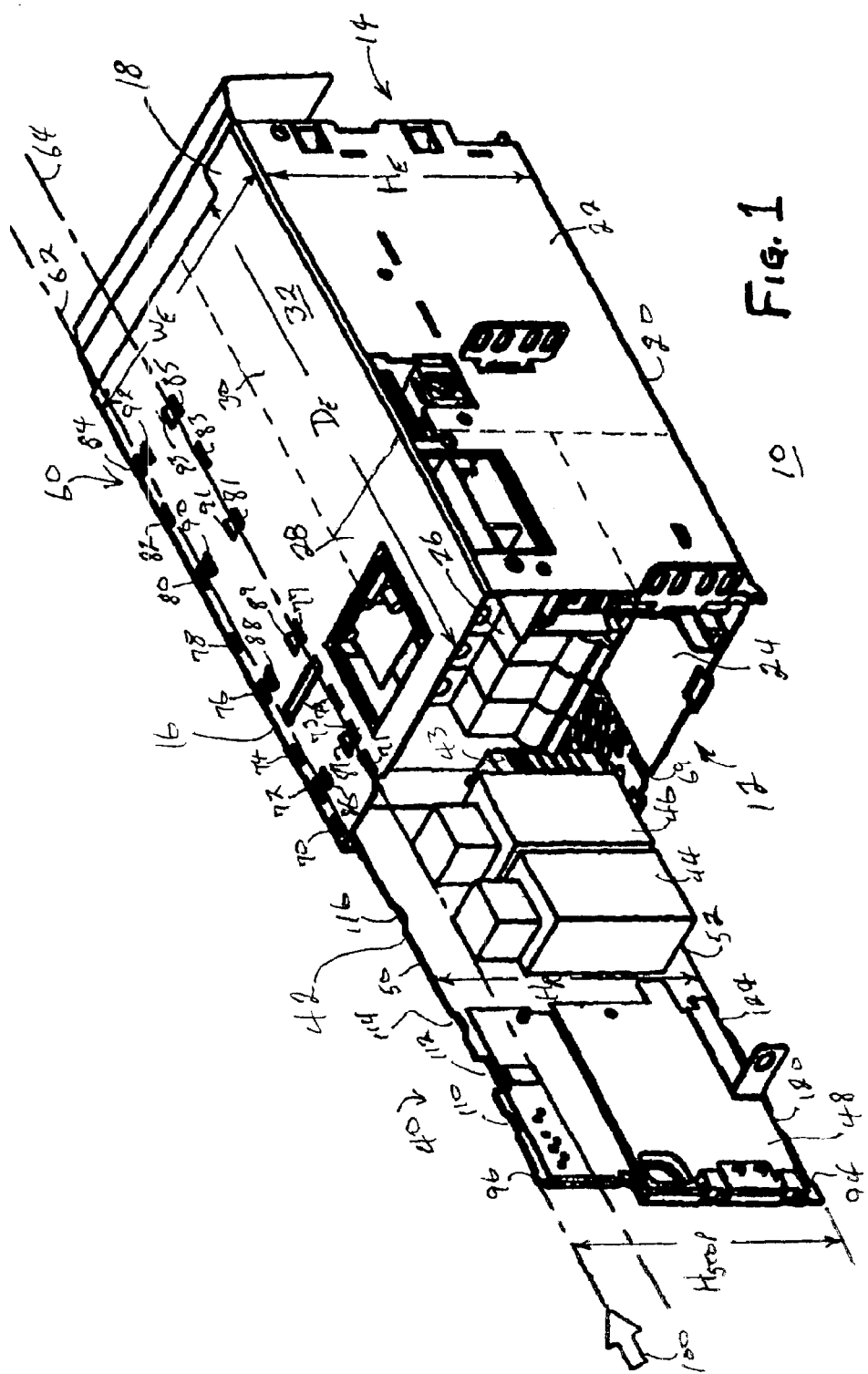
FIG. 1 is a perspective view of a representative equipment cabinet employing the system and method of the present invention with a replacement component poised for installation.

FIG. 1 is a perspective view of a representative equipment cabinet employing the system and method of the present invention with a replacement component poised for installation. In FIG. 1, an equipment cabinet 10 suitable for installation in an equipment rack or closet or other equipment collection (not shown in FIG. 1) includes a front end 12, a rear end 14 and sides 16, 18, 20, 22 that define a cabinet height $H_E$, a cabinet width $W_E$ and a cabinet depth $D_E$. Cabinet height $H_E$, cabinet width $W_E$ and cabinet depth $D_E$ define a cabinet or equipment volume 24. An installed component 26 is installed in equipment cabinet 10 in an occupied volume 28 (indicated with dotted lines in FIG. 1) within equipment volume 24. There is thereby established a replaceable component or receiving volume 30 between occupied volume 28 and rear end 14. In its preferred embodiment illustrated in FIG. 1, equipment cabinet 10 is substantially in the shape of a right parallelepiped.

A replaceable component 40 includes a substrate 42 and modules 44, 46, 48 mounted upon substrate 42. Substrate 42 presents a first edge 50 and a second edge 52. In its preferred embodiment illustrated in FIG. 1, substrate 42 is substantially planar, and edges 50, 52 are substantially parallel and substantially coplanar with substrate 42. Replaceable component 40 is configured having an appropriate height $H_R$ that permits insertion of replaceable component within equipment volume 24 with substrate 42 substantially parallel with sides 16, 22.

A guide structure 60 is provided in equipment cabinet 10 for guiding insertion of replaceable component 40 to a replaceable component locus 32 within replaceable component volume 30. Guide structure 60 defines a replacement route for insertion of replaceable component 40 to replaceable component locus 32 via a plurality of replacement paths. Guide structure 60 may be fashioned in any configuration that establishes such replacement paths, including channels formed by bending, stamping or otherwise forming opposing faces 18, 20 to establish ridges in opposing faces 18, 20 with a separation between adjacent ridges for receiving edges 50, 52 and slidingly guiding replaceable component 40 during insertion within equipment volume 24.

The preferred embodiment of guide structure 60 (FIG. 1) is easier and cheaper to implement than formed ridges in opposing faces of equipment cabinet 10. Tabs are punched in opposing faces 18, 20 to provide intermittent guiding engagement with edges 50, 52. Tabs are established in axes 62, 64 for delineating at least two replacement paths of the plurality of replacement paths that are traversed by replaceable component 40 during installation at replaceable component locus 32. Thus, tabs 70, 72, 74, 76, 78, 80, 82, 84, 86, 88, 90, 92 are established in face 18 as by, for example, punching or stamping to extend into equipment volume 24, to establish a replacement path segment substantially oriented about axis 62. Tabs (72, 86), tabs (76, 88), tabs (80, 90) and tabs (84, 92) are arranged in facing relation as tab-sets to support edge 50 from two sides during passage of substrate 42 along axis 62. Remaining tabs 70, 74, 78, 82 are arranged to support edge 50 on one side during passage of substrate 42 along axis 62. A similar array of tabs (not visible in FIG. 1) is provided in face 20 (opposing face 18) to support edge 52 during passage of substrate 42 along axis 62.

Tabs 73, 75, 77, 81, 83, 85, 87, 89, 91, 93 are established in face 18 as by, for example, punching or stamping to extend into equipment volume 24, to establish a replacement path segment substantially oriented about axis 64. Tabs (73, 87), tabs (77, 89), tabs (81, 91) and tabs (85, 93) are arranged in facing relation as tab-sets to support edge 50 from two sides during passage of substrate 42 along axis 64. Remaining tabs 75, 83 are arranged to support edge 50 on one side during passage of substrate 42 along axis 64. A similar array of tabs (not visible in FIG. 1) is provided in face 20 (opposing face 18) to support edge 52 during passage of substrate 42 along axis 64. The similar array of tabs in face 20 is preferably substantially symmetrically situated with respect to tabs in side 18 described above. However, such symmetry is not required for successful practicing the apparatus or method of the present invention.

Figure 2:
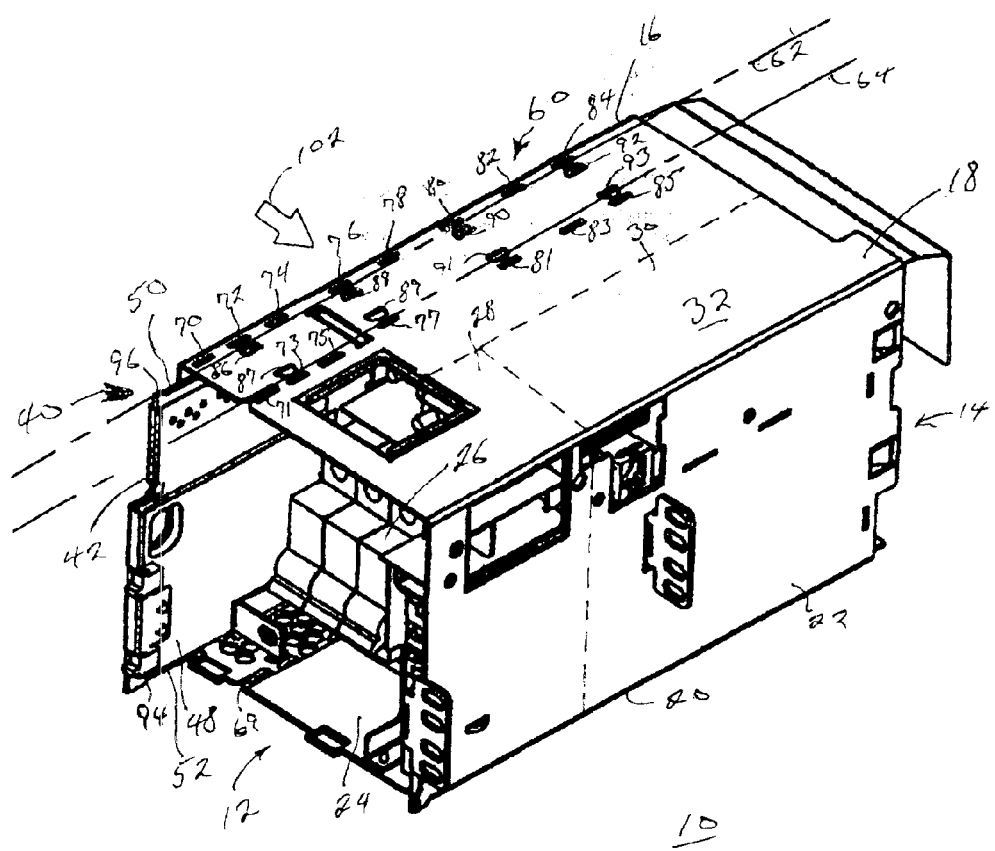
FIG. 2 is a perspective view of the representative equipment cabinet illustrated in FIG. 1 with the replacement component in a first interim position during installation.

Clearance between installed component 26 and face 16 is sufficient to permit passage of replaceable component 40 (including replacement modules 44, 46) along axis 62 into equipment volume 24. Extension structures 94, 96 may be provided in substrate 42 to limit travel of substrate 42 into equipment volume 24 to a predetermined depth. Extension structures 94, 96 may establish a stop height $H_{STOP}$ that is greater than height $H_R$. Thus, substrate 42 may be inserted along axis 62 into equipment volume 24 until extension structures 94, 96 abut equipment cabinet 10 at faces 18, 20. In an alternate embodiment, other stop interference structures may be provided between substrate 42 and equipment cabinet 10 to limit insertion of substrate 42 within equipment volume 24 at another depth than a depth that permits abutting between equipment cabinet 10 and extension structures 94, 96. Interference between faces 18, 20 and extension structures 94, 96 (or an alternate stop structure) prevents excessive insertion of substrate 42 into equipment volume 24 along axis 62. Insertion of substrate 42 into equipment volume 24 along axis 62 is effected by an insertion force applied substantially along axis 62, as indicated by an arrow 100. Insertion of substrate 42 into equipment volume 24 until extension structures 94, 96 are in spaced relation with equipment cabinet 10 situates substrate 42 at a first interim position during installation, as illustrated in FIG. 2. Slots 69, 71 are provided for cooperation with extension structures 94, 96 for providing lateral stabilization to substrate 42 in its installed orientation, as will be described later in connection with FIG. 4.

Substrate 42 is provided with a plurality of discontinuities 110, 114, 116 in edge 50 and similar discontinuities 120, 124 visible in edge 52. Thus, edges 50, 52 are scalloped, or notched or are otherwise formed as crenate edges by discontinuities 110, 114, 116, 120, 124. Discontinuities 110, 114, 116, 120, 124 are proportioned to clear tabs 86, 88, 90, 92.

Replaceable component 40 includes a power connection component 43, such as a plug array. Power connection component 43 is configured and arranged for engaging a complementary power supply component (not shown in detail) inside equipment cabinet 10 for engaging power component 43 to provide power to replaceable component 40 when replaceable component 40 is in its installed position at replaceable component locus 32.

FIG. 2 is a perspective view of the representative equipment cabinet illustrated in FIG. 1 with the replaceable component 40 in a first interim position during installation. In FIG. 2, replaceable component 40 is in a first interim installation position with extension structures 94, 96 in spaced relation with equipment cabinet 10. It is at this part of installing replaceable component 40 at replaceable component locus 32 that a second replacement path is used.

In the first interim installation position for replaceable component 40 illustrated in FIG. 2, discontinuity 110 is substantially adjacent with tab 86, discontinuity 114 is substantially adjacent with tab 88 and discontinuity 116 is substantially adjacent with tab 92. Discontinuities in edge 52 of substrate 42 (e.g., discontinuities 120, 124, 126) are similarly aligned substantially adjacent with respective tabs provided in face 20. Discontinuities and their respective adjacent tabs are not visible in FIG. 2. Tabs and discontinuities associated with edge 50 and side 18 are preferably substantially symmetrically arranged with tabs and discontinuities associated with edge 52 and side 20, but such symmetry is not required for successfully practicing the apparatus and method of the invention.

A second replacement path segment may now be traversed by replaceable component 40 by applying an installation force against substrate 42 in a direction substantially perpendicular with axis 62, as indicated by an arrow 102. Discontinuity 110 passes over tabs 86, 87; discontinuity 114 passes over tabs 88, 89; discontinuity 116 passes over tabs 90, 91; another discontinuity in edge 50 (not visible in FIGS. 1 and 2) passes over tabs 92, 93; and discontinuities associated with edge 52 pass over tabs in face 20 in a similar manner. The second replacement path situates substrate 42 in a position for sliding movement in a third replacement path along axis 64, as illustrated in FIG. 3.

Figure 3:
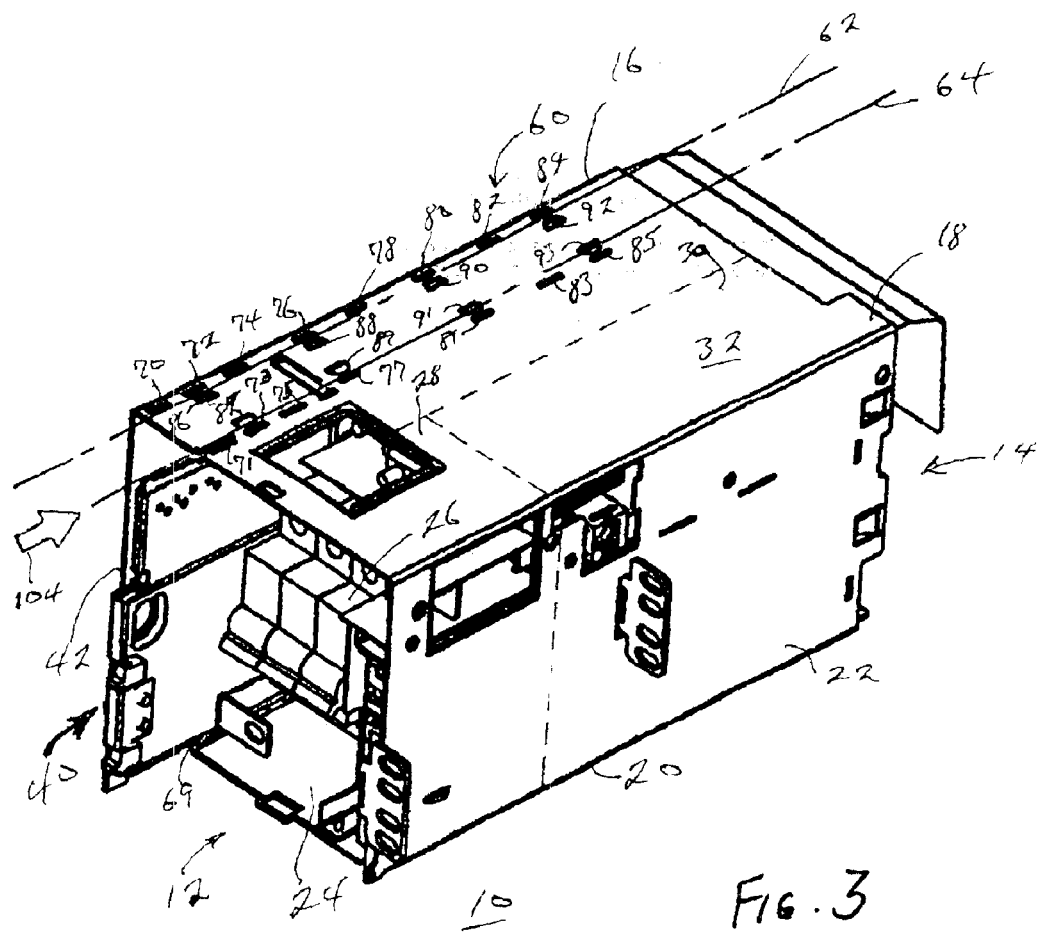
FIG. 3 is a perspective view of the representative equipment cabinet illustrated in FIGS. 1 and 2 with the replacement component in a second interim position during installation.

FIG. 3 is a perspective view of the representative equipment cabinet illustrated in FIGS. 1 and 2 with the replaceable component 40 in a second interim position during installation. In FIG. 3, modules 44, 46 (FIG. 1; not visible in FIG. 3) are located in replaceable component volume 30 between installed component 26 and rear end 14, but replaceable component 40 is not yet situated at replaceable component locus 32. Application of an installation force substantially along axis 64, as indicated by an arrow 104, moves substrate 42 along a third replacement path in sliding engagement with tabs 73, 75, 77, 81, 83, 85, 87, 89, 91, 93 from the second interim installation position illustrated in FIG. 3 to an installed position illustrated in FIG. 4.

Figure 4:
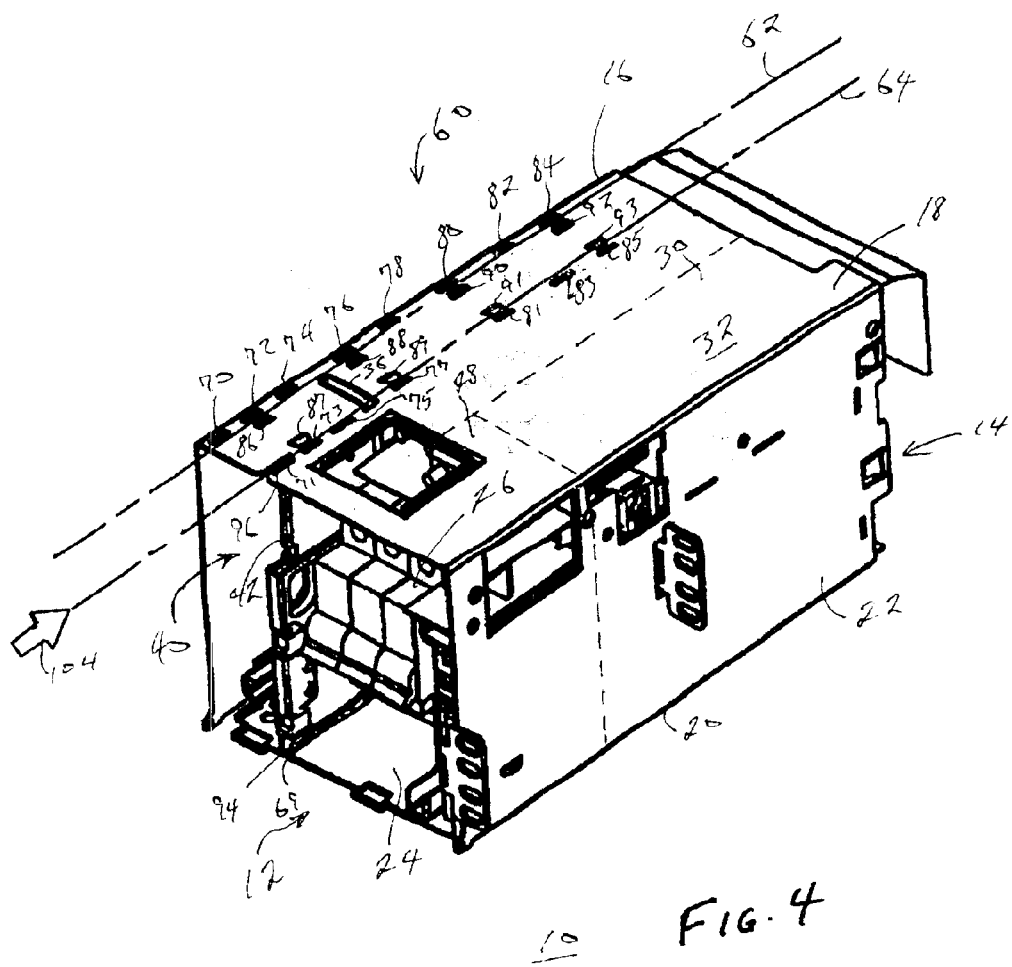
FIG. 4 is a perspective view of the representative equipment cabinet illustrated in FIGS. 1, 2 and 3 with the replacement component in an installed position.

FIG. 4 is a perspective view of the representative equipment cabinet illustrated in FIGS. 1, 2 and 3 with the replaceable component 40 in an installed position. In FIG. 4, replaceable component 40 is in its installed orientation at replaceable component locus 32 with power connection component engaged with a power providing component in equipment cabinet 10 (not shown in detail). Extension structures 94, 96 are received within slots 69, 71 to aid in lateral stabilization of replaceable component 40 in directions perpendicular with substrate 42.

In the preferred embodiment of the invention illustrated in FIGS. 1–4, a first stop structure 36 is provided in the form of a tab extending from side 18 into equipment volume 24 across axis 64. Further, a second stop structure 112 is provided in edge 50 of substrate 42. First stop structure 36 and second stop structure 112 cooperate during removal of replaceable component 40 from equipment cabinet 10 in that second stop structure 112 abuts first stop structure 36 on axis 64 in the second interim installation position illustrated in FIG. 3. That is, stop structures 36, 112 cooperate to ensure that replaceable component 40 is properly situated for lateral movement substantially perpendicular with axes 62, 64 for traversing from second interim position (FIG. 3) to first interim position (FIG. 2). Discontinuities in edges 50, 52 traverse tabs aligned along axis 64 along the second replacement path earlier described, but in an opposite direction than previously described, during removal of replaceable component 40 from equipment cabinet 10 to a position appropriate for sliding movement of substrate 42 substantially along axis 62 to remove replaceable component 40 from equipment cabinet 10. First stop structure 36 does not interact with second stop structure 112 when substrate 42 is moved along axis 62 because first stop structure 36 does not cross axis 62.

Figure 5:
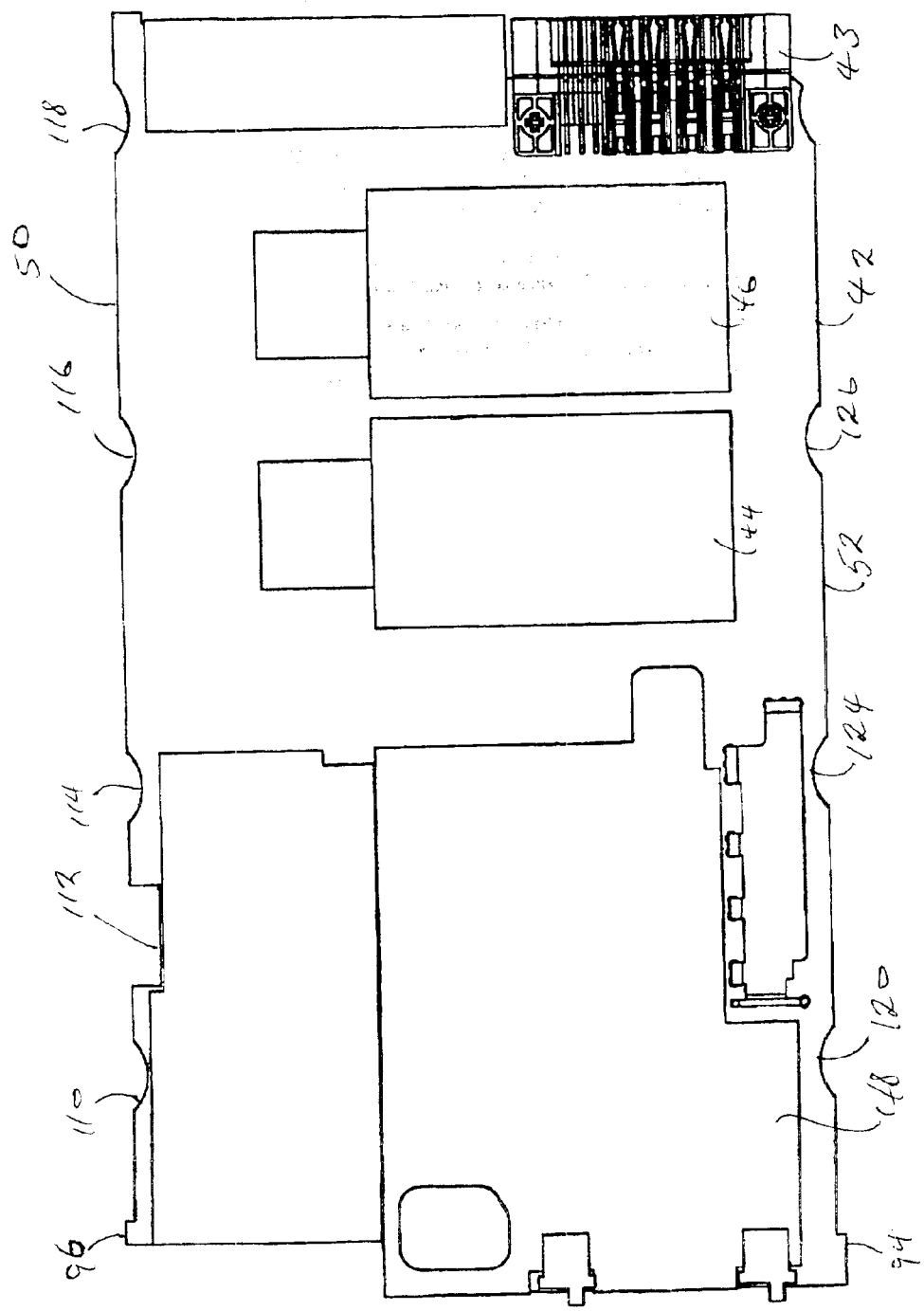
FIG. 5 is a plan view of a replacement component configured according to the teachings of the present invention.

FIG. 5 is a plan view of a replaceable component 40 configured according to the teachings of the present invention. In FIG. 5, replaceable component 40 includes a substrate 42 and modules 44, 46, 48 mounted upon substrate 42. A power connecting component 43, such as an electrical plug array, is provided for connecting with a power providing structure in an equipment cabinet (not shown) for electrically coupling with power connection component 43 to provide power to replaceable component 40. Electrical connections among parts of replaceable component 40 are not shown in detail in FIG. 5. Substrate 42 presents a first edge 50 and a second edge 52. In its preferred embodiment illustrated in FIG. 5, substrate 42 is substantially planar, and edges 50, 52 are substantially parallel and substantially coplanar with substrate 42.

Substrate 42 is provided with a plurality of discontinuities 110, 114, 116, 118 in edge 50 and similar discontinuities 120, 124, 126 in edge 52. Thus, edges 50, 52 are scalloped, or notched or are otherwise formed as crenate edges by discontinuities 110, 114, 116, 118, 120, 124, 126. Discontinuities 110, 114, 116, 118, 120, 124, 126 are proportioned to clear tabs 86, 87, 88, 89, 90, 91, 92, 93 as described earlier herein in connection with FIGS. 1–4.

Figure 6:
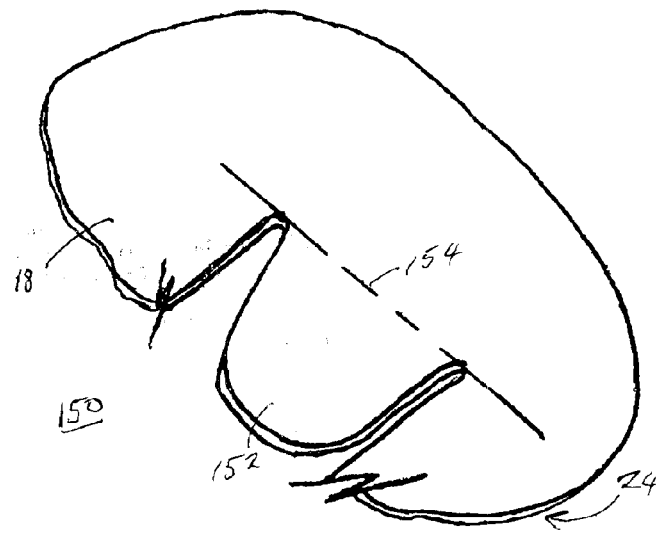
FIG. 6 is a breakaway perspective view of a first tab structure appropriate for use with the present invention.

FIG. 6 is a breakaway perspective view of a first tab structure appropriate for use with the present invention. In FIG. 6, a tab structure 150 is illustrated in situ in a portion of side 18 above equipment volume 24. A depending portion 152 diverts from the plane of side 18 into equipment volume 24 about a bend line 154. Tab structure 150 may be created using a stamping or punching operation or any other manufacturing operation that yields substantially the structure illustrated in FIG. 6. Tab structure 150 is particularly suitable for tabs 86, 87, 88, 89, 90, 91, 92, 93 (FIGS. 1–4) in the preferred embodiment of the present invention.

Figure 7:
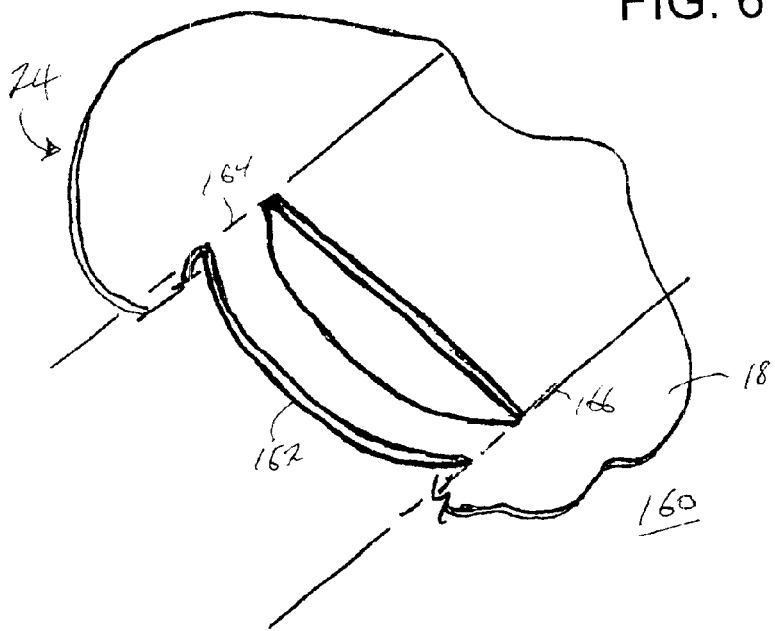
FIG. 7 is a breakaway perspective view of a second tab structure appropriate for use with the present invention.

FIG. 7 is a breakaway perspective view of a second tab structure appropriate for use with the present invention. In FIG. 7, a tab structure 160 is illustrated in situ in a portion of side 18 above equipment volume 24. A depending portion 162 diverts from the plane of side 18 into equipment volume 24 about bend lines 164, 166. Tab structure 160 may be created using a stamping or punching operation or any other manufacturing operation that yields substantially the structure illustrated in FIG. 7. Tab structure 160 is particularly suitable for tabs 70, 72, 73, 74, 75, 76, 77, 78, 80, 81, 82, 83, 84, 85 (FIGS. 1–4) in the preferred embodiment of the present invention.

Figure 8:
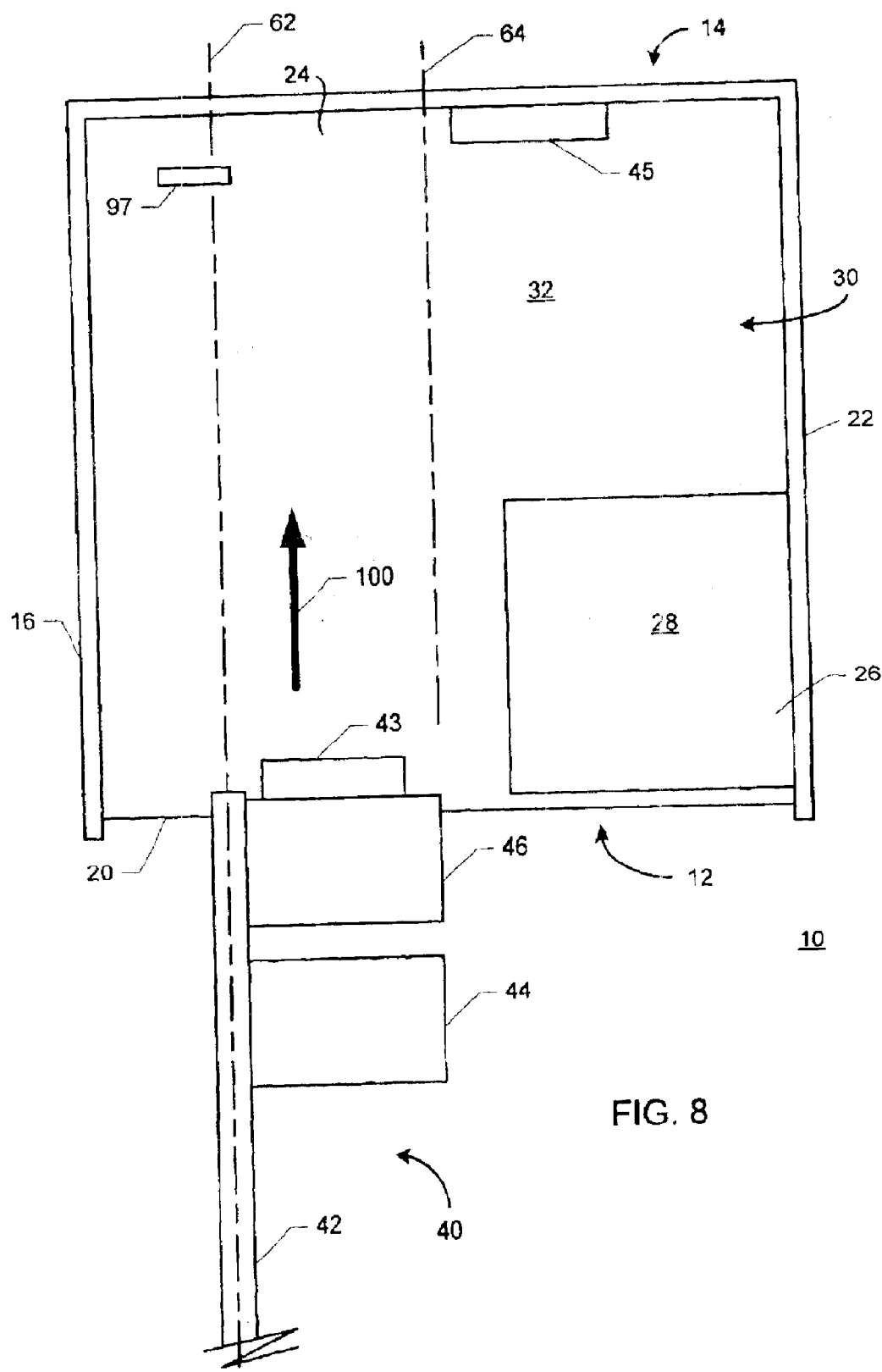
FIG. 8 is a top plan schematic view of the apparatus of the present invention being assembled with a replacement component poised for installation similar to the poised position illustrated in FIG. 1.

FIG. 8 is a top plan schematic view of the apparatus of the present invention being assembled with a replacement component poised for installation similar to the poised position illustrated in FIG. 1. In FIG. 8, equipment cabinet 10 includes a front end 12, a rear end 14 and sides 16, 18, 20, 22 that define a cabinet volume 24. Installed component 26 is installed in equipment cabinet 10 in occupied volume 28 within equipment volume 24. Replaceable component volume 30 is situated between occupied volume 28 and rear end 14.

Replaceable component 40 includes a substrate 42 and modules 44, 46 mounted upon substrate 42. Substrate 42 is substantially planar and oriented about an axis 62 in the poised position illustrated in FIG. 8. Two axes 62, 64 delineate at least two replacement paths of a plurality of replacement paths that are traversed by replaceable component 40 during installation at replaceable component locus 32 by slidingly guiding replaceable component 40 during insertion within equipment volume 24. Axis 62 is substantially aligned with a first replacement path; axis 64 is substantially aligned with a second replacement path.

Clearance between installed component 26 and face 16 is sufficient to permit passage of replaceable component 40 (including replacement modules 44, 46) along axis 62 into equipment volume 24. A stop structure 97 may be provided within equipment volume 24 to limit travel of replaceable component 40 into equipment volume 24 to a predetermined depth. Stop structure 97 may be provided, for example, by affixing stop structure 97 to side 20, or by integrally forming stop structure 97 from side 20. Thus, replaceable component 40 may be inserted along axis 62 into equipment volume 24 until replaceable component 40 abuts stop structure 97. Interference between replaceable component 40 and stop structure 97 (or an alternate stop structure; discussed in connection with FIG. 1) prevents excessive insertion of replaceable component 40 into equipment volume 24 along axis 62. Insertion of replaceable component 40 into equipment volume 24 along axis 62 is effected by an insertion force applied substantially along axis 62, as indicated by an arrow 100. Insertion of replaceable component 40 into equipment volume 24 until replaceable component 40 is in adjacent relation with stop structure 97 situates replaceable component 40 at a first interim position during installation, as illustrated in FIG. 9.

Figure 11:
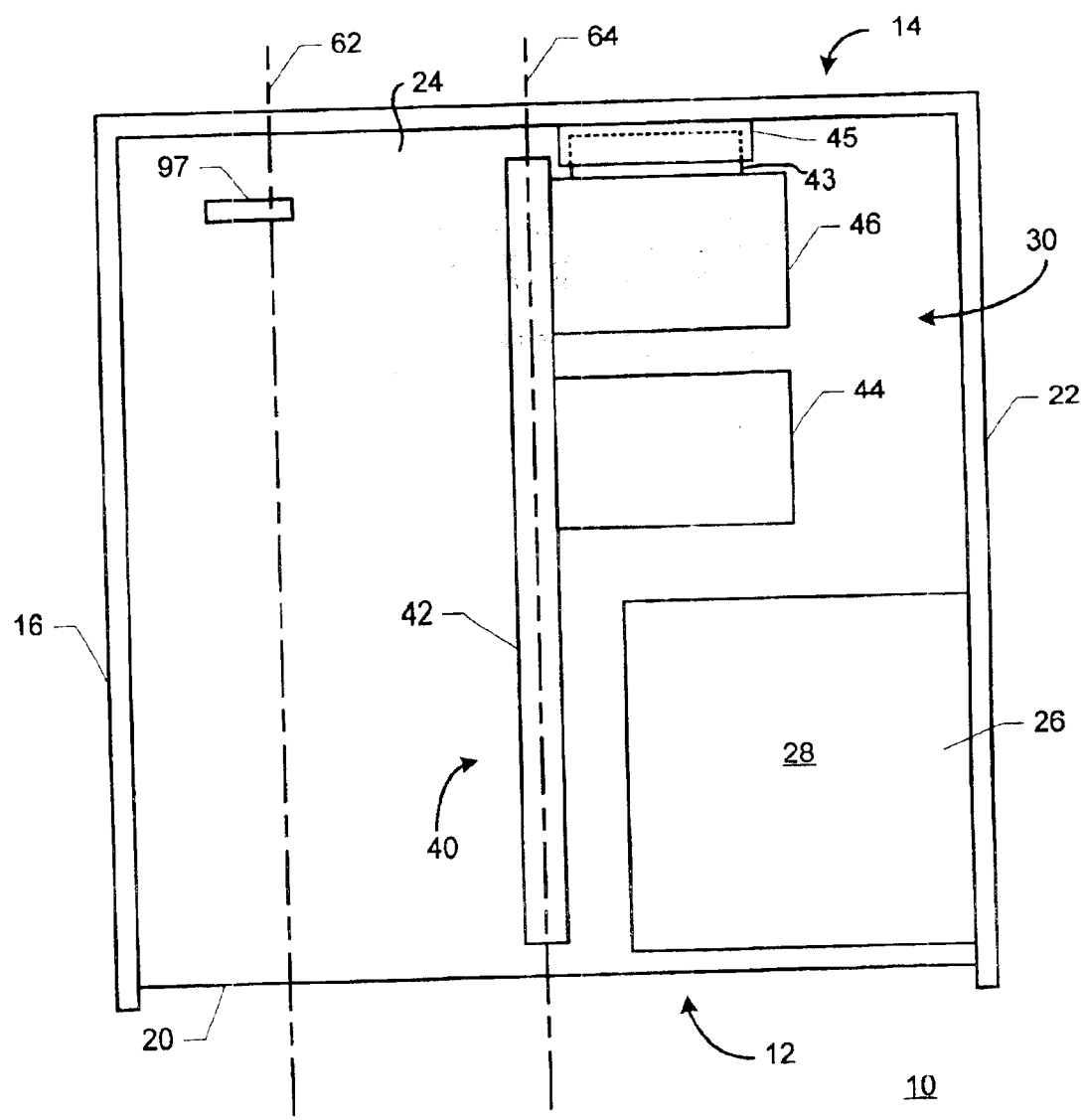
FIG. 11 is a top plan schematic view of the apparatus of the present invention being assembled with the replacement component in an installed position similar to the installed position illustrated in FIG. 4.

Replaceable component 40 includes a power connection component 43, such as a plug array. Power connection component 43 is configured and arranged for engaging a complementary power supply component 45 (not shown in detail) inside equipment cabinet 10 for engaging power component 43 to provide power to replaceable component 40 when replaceable component 40 is in its installed position at replaceable component locus 32 (FIG. 11).

Figure 9:
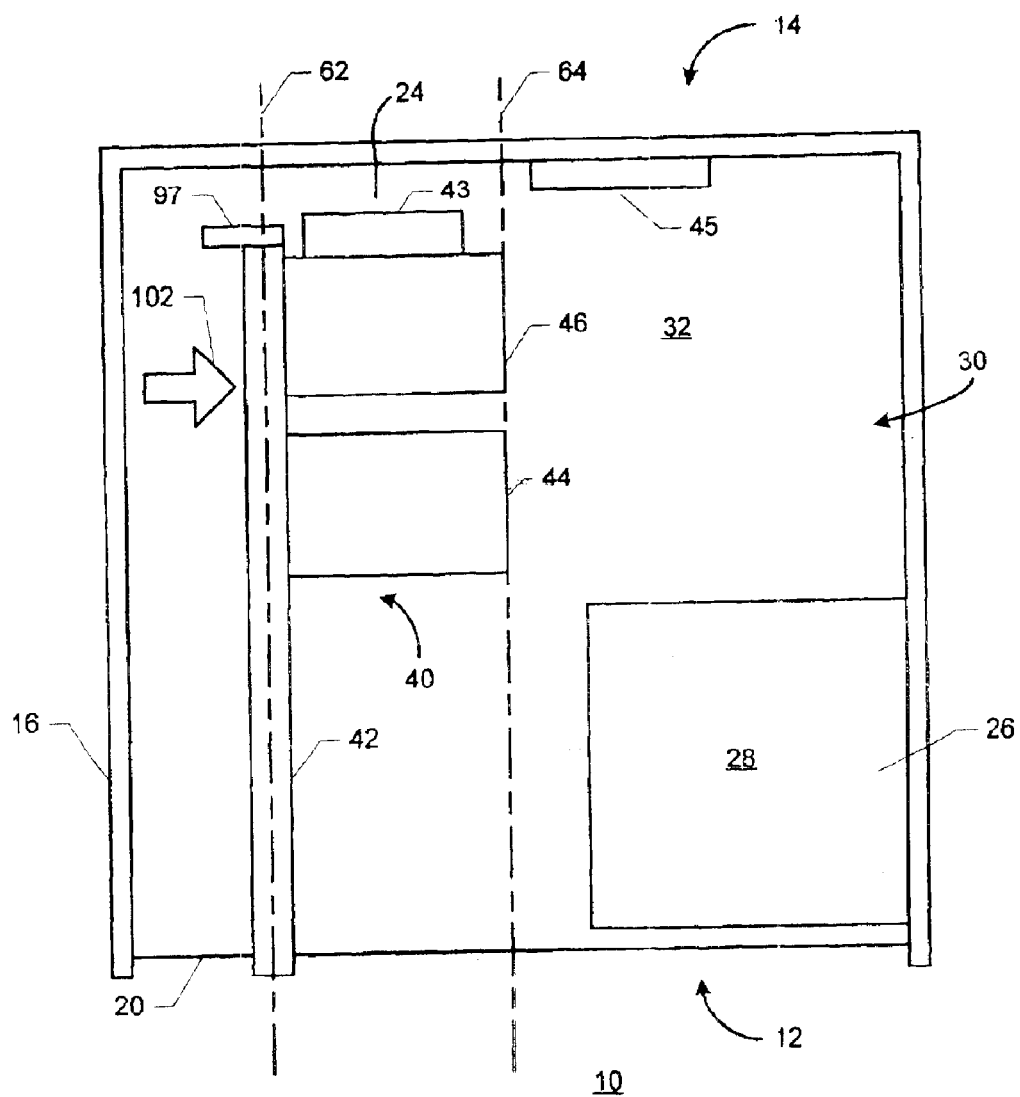
FIG. 9 is a top plan schematic view of the apparatus of the present invention being assembled with the replacement component in a first interim position during installation similar to the first interim position illustrated in FIG. 2.

FIG. 9 is a top plan schematic view of the apparatus of the present invention being assembled with the replacement component in a first interim position during installation similar to the first interim position illustrated in FIG. 2. In FIG. 9, replaceable component 40 is in a first interim installation position with replaceable component 40 in adjacent relation with stop structure 97. It is at this part of installing replaceable component 40 at replaceable component locus 32 that a second replacement path is used. The second replacement path is substantially perpendicular with axes 62, 64 and permits moving replaceable component 40 from substantial alignment with axis 62 to substantial alignment with axis 64.

In the first interim installation position for replaceable component 40 illustrated in FIG. 9, selected discontinuities in substrate 42 are aligned with substantially mating tabs in equipment cabinet 10 (not shown in FIG. 9; discussed above in connection with FIGS. 1–7) to permit moving replaceable component 40 along the second replacement path.

The second replacement path is traversed by replaceable component 40 by applying an installation force against replaceable component 40 in a direction substantially perpendicular with axis 62, as indicated by arrow 102. Respective discontinuities pass over mating tabs (see FIGS. 1–7) to permit movement of replaceable component 40 along the second replacement path to situate replaceable component 40 in a second interim position (FIG. 3) from which replaceable component 40 may be slidingly moved in a third replacement path along axis 64.

Figure 10:
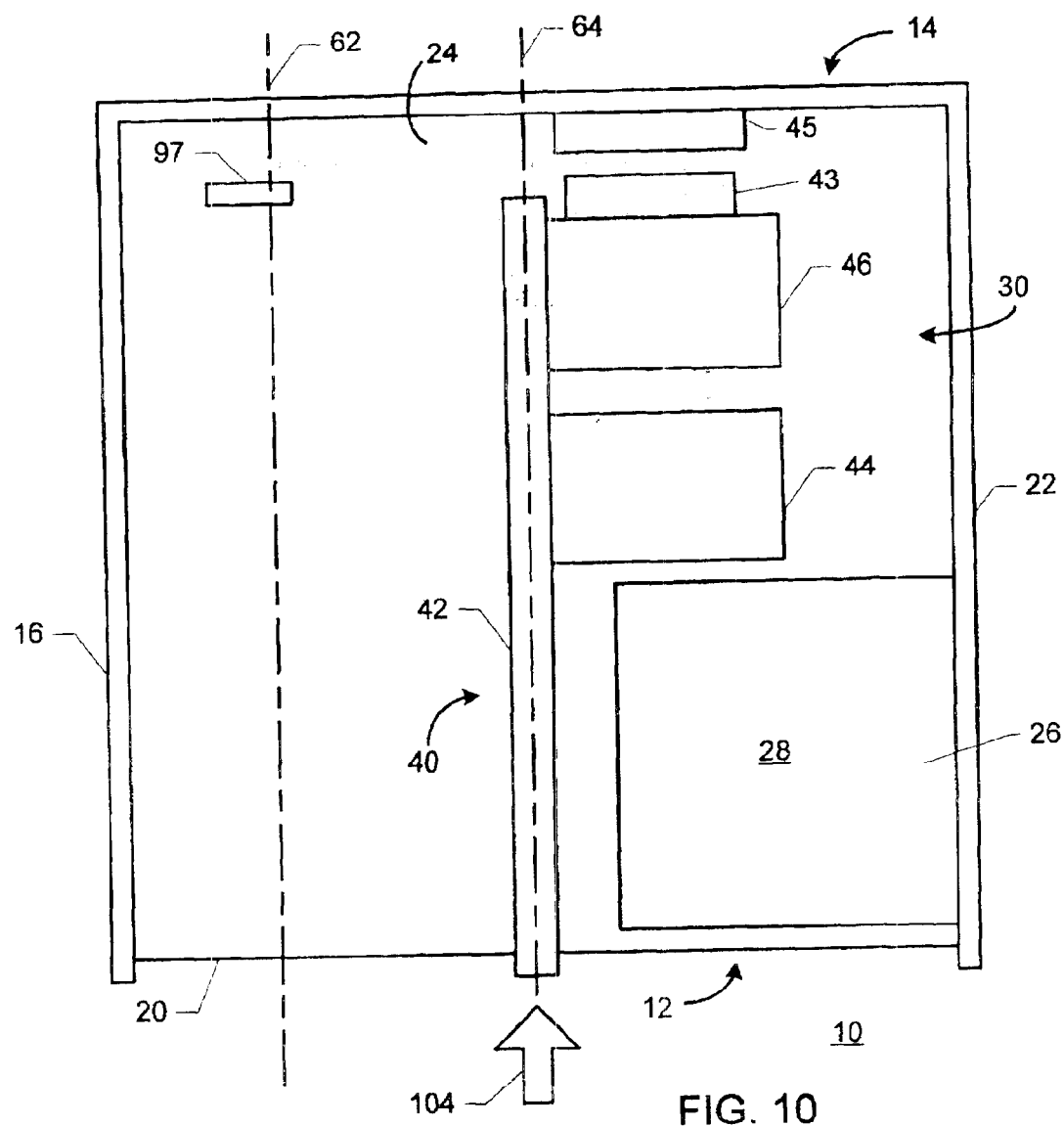
FIG. 10 is a top plan schematic view of the apparatus of the present invention being assembled with the replacement component in a second interim position during installation similar to the second interim position illustrated in FIG. 3.

FIG. 10 is a top plan schematic view of the apparatus of the present invention being assembled with the replacement component in a second interim position during installation similar to the second interim position illustrated in FIG. 3. In FIG. 10, modules 44, 46 are located in replaceable component volume 30 between installed component 26 and rear end 14, but replaceable component 40 is not yet situated at replaceable component locus 32. Application of an installation force substantially along axis 64, as indicated by an arrow 104, moves replaceable component 40 along a third replacement path in a sliding movement along axis 64 from the second interim position illustrated in FIG. 10 toward an installed position (FIG. 1).

FIG. 11 is a top plan schematic view of the apparatus of the present invention being assembled with the replacement component in an installed position similar to the installed position illustrated in FIG. 4. In FIG. 11, replaceable component 40 is in its installed position or orientation at replaceable component locus 32 with power connection component 43 engaged with a power providing component 45 in equipment cabinet 10.

Removal of replaceable component 40 from equipment cabinet 10 may be effected by urging replaceable component 40 along the various replacement paths of the replacement route in reverse order from the order described in connection with installation of replacement component 40 (i.e., as illustrated in FIGS. 11, 10, 9, 8) to the first interim position (FIG. 9) appropriate for sliding movement of replaceable component 40 substantially along axis 62 through the poised position (FIG. 8) to remove replaceable component 40 from equipment cabinet 10.

Figure 12:
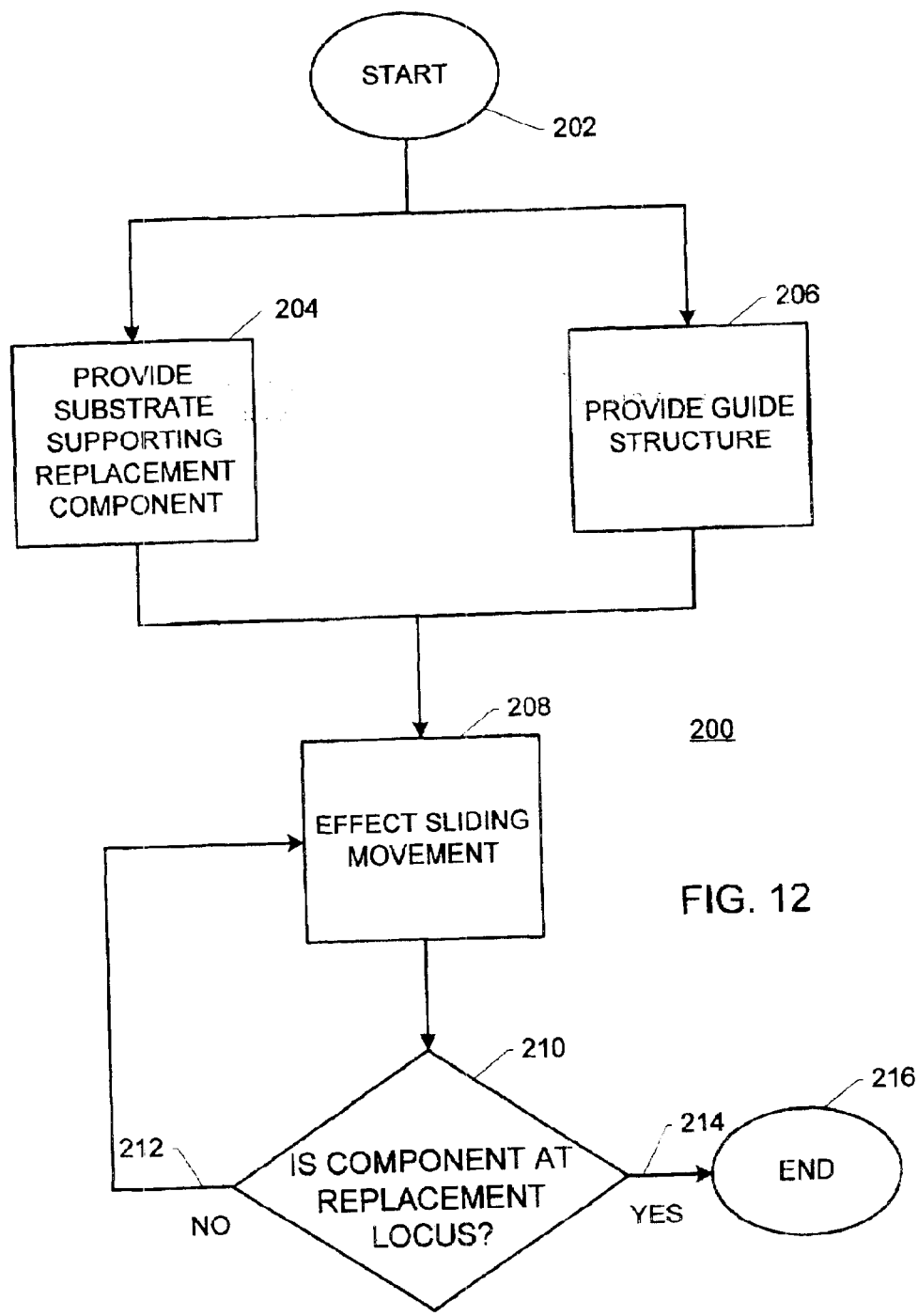
FIG. 12 is a flow diagram illustrating the method of the present invention.

FIG. 12 is a flow diagram illustrating the method of the present invention. In FIG. 12, a method 200 for installing a replaceable component 40 in an equipment cabinet at a replaceable component locus begins at a START locus 202. The cabinet has a front plane, a back plane and a plurality of side planes. A fixed component occupies a first volume extending from the front plane toward the back plane and establishing a replaceable component volume between the first volume and the back plane. Method 200 proceeds from START locus 202 with, in no particular order: (1) providing a substrate supporting the replaceable component, as indicated by a block 204, and (2) providing a guide structure fixed with the cabinet, as indicated by a block 206. The substrate presents a first edge and a second edge that are substantially coplanar in a substrate plane and substantially parallel. The guide structure cooperates with the substrate for slidingly moving the substrate along a replacement route between the front plane and a replaceable component locus in the replaceable component volume.

Method 200 continues by effecting a sliding movement using alternate first and second installation movements, as indicated by a block 208. The first installation movement is responsive to a first installation force applied to the substrate in the substrate plane. The second installation movement is responsive to a second installation force applied generally perpendicular with the substrate plane.

Method 200 next inquires whether the replaceable component is at the replaceable component locus, as indicated by a query block 210. If the replaceable component is not at the replaceable component locus, method 200 proceeds via NO response line 212 to return to effecting sliding movement of the replaceable component using one of the alternate first and second installation movements (block 208). If the replaceable component is at the replaceable component locus, method 200 proceeds via YES response line 214 to end, as indicated by an END locus 216.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims.

We claim:

1. A system for situating a replaceable component within an equipment cabinet; said cabinet having an equipment volume bounded by a plurality of cabinet faces, including a cabinet front, a cabinet rear and a cabinet top and a cabinet bottom, a first cabinet side and a second cabinet side; said cabinet front being at least partially open for providing access to said replaceable component; said equipment volume being partially filled by a fixed component in an occupied volume within said equipment volume; said occupied volume establishing a receiving volume within said equipment volume between said occupied volume and at least one cabinet face of said plurality of cabinet faces; the system comprising:

(a) a substrate; said substrate supporting said replaceable component; said substrate having a generally planar polygonal shape bounded by a plurality of peripheral edges and presenting a first said peripheral edge and a second said peripheral edge substantially parallel with said first peripheral edge; and (b) a guide structure; said guide structure being fixed with respect to said cabinet; said guide structure cooperating with at least one of said first peripheral edge and said second peripheral edge to effect sliding movement of said substrate between said cabinet front and a replaceable component locus in said replaceable component volume; said sliding movement being carried out in a plurality of non-collinear step-wise insertion segments oriented for effecting said sliding movement along a replacement route via a plurality of predetermined paths between said cabinet front and said replaceable component locus.

2. A system for situating a replaceable component within an equipment cabinet as recited in claim 1, wherein said cabinet is generally in the shape of a right parallelepiped.

3. A system for situating a replaceable component within an equipment cabinet as recited in claim 1, wherein said replacement route includes at least three of said non-collinear step-wise insertion segments.

4. A system for situating a replaceable component within an equipment cabinet as recited in claim 1, wherein said guide structure comprises a plurality of channels for slidingly receiving said first edge and said second edge.

5. A system for situating a replaceable component within an equipment cabinet as recited in claim 1, wherein said guide structure comprises a plurality of tabs, said plurality of tabs being aligned in a plurality of tab sets; each respective tab set of said plurality of tab sets establishing at least one insertion segment of said plurality of insertion segments.

6. A system for situating a replaceable component within an equipment cabinet as recited in claim 5, wherein at least one edge of said first edge and said second edge has at least one discontinuity; said at least one discontinuity being proportioned to clear at least one selected tab of said plurality of tabs for effecting said sliding movement of said substrate past at least one selected tab set of said plurality of tab sets.

7. A system for situating a replaceable component within an equipment cabinet as recited in claim 2, wherein said replacement route includes at least three of said non-collinear step-wise insertion segments.

8. A system for situating a replaceable component within an equipment cabinet as recited in claim 7, wherein said guide structure comprises a plurality of tabs, said plurality of tabs being aligned in a plurality of tab sets; each respective tab set of said plurality of tab sets establishing at least one insertion segment of said plurality of non-collinear insertion segments.

9. A system for situating a replaceable component within an equipment cabinet as recited in claim 8, wherein at least one edge of said first edge and said second edge has at least one discontinuity; said at least one discontinuity being proportioned to clear at least one selected tab of said plurality of tabs for effecting said sliding movement of said substrate past at least one selected tab set of said plurality of tab sets.

10. A system configured for installing a replaceable component in an equipment cabinet at a replaceable component locus; said cabinet having front plane, a back plane and a plurality of side planes; a fixed component occupying a first volume extending from said front plane toward said back plane and establishing a replaceable component volume between said first volume and said back plane; the system comprising:

(a) a substrate supporting said replaceable component; said substrate having a generally planar polygonal shape bounded by a plurality of peripheral edges and presenting a first said peripheral edge and a second said peripheral edge substantially parallel; and (b) a guide structure fixed with said cabinet; said guide structure cooperating with at least one of said first peripheral edge and said second peripheral edge to slidingly move said substrate along a replacement route between said front plane and a replaceable component locus in said replaceable component volume; said sliding movement being carried out in first and second installation movements; said first installation movement moving said substrate in a first direction from said front plane toward said replaceable component locus; said second installation movement moving said substrate in a second direction generally parallel with said front plane.

11. A system configured for installing a replaceable component in an equipment cabinet at a replaceable component locus as recited in claim 10, wherein said guide structure comprises a plurality of channels for slidingly receiving said first edge and said second edge.

12. A system configured for installing a replaceable component in an equipment cabinet at a replaceable component locus as recited in claim 10, wherein said guide structure comprises a plurality of tabs, said plurality of tabs being aligned in a plurality of tab sets; each respective tab set of said plurality of tab sets being aligned for effecting at least one installation movement of said first and second installation movements.

13. A system configured for installing a replaceable component in an equipment cabinet at a replaceable component locus as recited in claim 12, wherein at least one edge of said first edge and said second edge has at least one discontinuity; said at least one discontinuity being proportioned to clear at least one selected tab of said plurality of tabs for effecting said sliding movement of said substrate past at least one selected tab set of said plurality of tab sets.

14. A method for installing a replaceable component in an equipment cabinet at a replaceable component locus; said cabinet having front plane, a back plane and a plurality of side planes; a fixed component occupying a first volume extending from said front plane toward said back plane and establishing a replaceable component volume between said first volume and said back plane; the method comprising the steps of:
  (a) in no particular order:
    (1) providing a substrate supporting said replaceable component; said substrate having a generally planar polygonal shape bounded by a plurality of peripheral edges and presenting a first said peripheral edge and a second said peripheral edge; said first peripheral edge and said second peripheral edge being substantially parallel; and
    (2) providing a guide structure fixed with said cabinet; said guide structure cooperating with at least one of said first peripheral edge and said second peripheral edge for slidingly moving said substrate along a replacement route between said front plane and a replaceable component locus in said replaceable component volume; and
  (b) effecting a sliding movement using alternate first and second installation movements; said first installation movement being responsive to a first installation force applied to said substrate in said substrate plane to advance said substrate in a first direction from said front plane toward said replaceable component locus; said second installation movement being responsive to a second installation force applied generally perpendicular with said substrate plane to move said substrate in a second direction generally parallel with said front plane.

15. A method for installing a replaceable component in an equipment cabinet at a replaceable component locus as recited in claim 14 wherein said guide structure comprises a plurality of channels for slidingly receiving said first edge and said second edge.

16. A method for installing a replaceable component in an equipment cabinet at a replaceable component locus as recited in claim 14 wherein said guide structure comprises a plurality of tabs, said plurality of tabs being aligned in a plurality of tab sets; each respective tab set of said plurality of tab sets being aligned for effecting at least one installation movement of said first and second installation movements.

17. A method for installing a replaceable component in an equipment cabinet at a replaceable locus as recited in claim 16 wherein at least one edge of said first edge and said second edge has at least one discontinuity; said at least one discontinuity being proportioned to clear at least one selected tab of said plurality of tabs for effecting said sliding movement of said substrate past at least one selected tab set of said plurality of tab sets.

\* \* \* \* \*